United States Patent [19]
Huh

[11] Patent Number: 5,902,706
[45] Date of Patent: May 11, 1999

[54] MASK FOR MAKING A SEMICONDUCTOR DEVICE AND FABRICATION METHOD THEREOF

[75] Inventor: Hoon Huh, Choongcheongbuk-Do, Rep. of Korea

[73] Assignee: LG Semicon Co., Ltd., Cheongju, Rep. of Korea

[21] Appl. No.: 08/916,328

[22] Filed: Aug. 22, 1997

[30] Foreign Application Priority Data

Mar. 26, 1997 [KR]  Rep. of Korea ................ 1997-10555

[51] Int. Cl.$^6$ ........................................ G03F 9/00
[52] U.S. Cl. .................................... 430/5; 378/35
[58] Field of Search ............... 430/5, 323; 216/72; 378/35

[56] References Cited

U.S. PATENT DOCUMENTS 5,754,619  5/1998  Yoshihara et al. ................ 378/35
5,773,177  6/1998  Ikeda et al. ..................... 430/5

*Primary Examiner*—S. Rosasco
*Attorney, Agent, or Firm*—Fleshner & Kim

[57] ABSTRACT

A mask for a semiconductor device includes a frame having an opening therein, a membrane film formed on the frame, and a patterned light shield formed on the membrane via an interlayer. To form the mask, an interlayer is formed on a first silicon layer, and a second silicon layer is formed on the interlayer. The second silicon layer is selectively etched to thereby form a plurality of openings therethrough, and a light shield is formed in a corresponding one of the openings. The remaining second silicon layer is removed, and a predetermined region of the first silicon layer is etched to expose the interlayer therethrough. A membrane film is formed on an entire lower surface of the resultant structure, and a predetermined region of the interlayer is etched to expose a predetermined region of the membrane film.

35 Claims, 4 Drawing Sheets

MASK FOR MAKING A SEMICONDUCTOR DEVICE AND FABRICATION METHOD THEREOF

BACKGROUND OF THE INVENTION

1. Field of the Invention

The present invention relates to a mask employed in a lithographic process, and more particularly, to an improved mask for making a semiconductor device and fabrication method thereof.

2. Background of the Related Art

FIGS. 1A through 1E illustrate a related art mask fabrication method applicable to an X-ray lithography for making a semiconductor device. As shown in FIG. 1A, on an upper and lower surface of a silicon substrate 11, a membrane film 12 formed of such material as $SiN_x$ or SiC is formed. On the upper membrane film 12, an absorber film 13 formed of a light-shielding material such as Au, W or Ta is formed. An oxide film 14 formed of $SiO_2$ is formed on the absorber film 13.

Referring to FIG. 1B, a photoresist film 15 is coated on the oxide film 14 and patterned. As shown in FIG. 1C, using the patterned photoresist film 15 as a mask, the oxide film 14 and the absorber film 13 are sequentially etched to form the patterned oxide film 14 and absorber film 13, respectively and then the patterned photoresist film 15 is removed. The patterned absorber film 13 serves as a mask against an X-ray lithography.

As shown in FIG. 1D, the central portions of the substrate 11 and the lower membrane film 12 are removed so as to expose a lower surface of the upper membrane film 12 therethrough. Finally, as shown in FIG. 1E, on the remaining lower surface of the lower membrane film 12, a glass frame 16 is attached to complete the related art mask fabrication.

However, the mask fabrication method according to the related art requires follow-up steps after forming the membrane film 12, such as forming the absorber film 13 and removing a central portion of the substrate 11 for completing the mask fabrication. A distortion is caused by a variety of stresses inflicted on the thinly formed membrane film 12 during the follow-up steps. Further, when the absorber film 13 is etched, a stress caused by plasma tends to deteriorate the mask structure, which results in an image displacement on a wafer serving as a lithographic object when an X-ray exposure using the related art mask is performed.

SUMMARY OF THE INVENTION

An object of the present invention is to solve the problems of the related art.

An object of the present invention is to minimize an image displacement on a wafer.

A further object is to prevent distortion and stress of a membrane film.

To achieve the above-described objects, advantages and/or features there is provided a mask for an X-ray lithography according to the present invention which includes a frame having an opening therein, a membrane film formed on the frame, and a patterned light shield formed on the membrane via an interlayer.

Further, to achieve the above-described objects, there is provided a mask for an X-ray lithography according to the present invention which includes the steps of forming an interlayer on a first silicon layer, forming a second silicon layer on the interlayer and selectively etching the second silicon layer to thereby form a plurality of openings therethrough, forming a light shield in the corresponding openings, removing the remaining second silicon layer, etching a region of the first silicon layer for thereby exposing the interlayer therethrough, forming a membrane film on an entire lower surface of the present structure, and etching a region of the interlayer for thereby exposing a region of the membrane film.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1A:
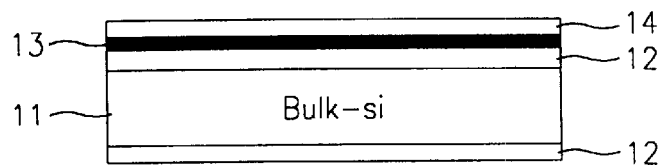
FIGS. 1A through 1E are cross-sectional views sequentially illustrating a related art mask fabrication method for a semiconductor device.
Figure 1B:
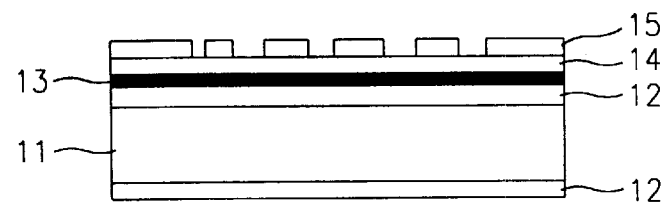
Figure 1C:
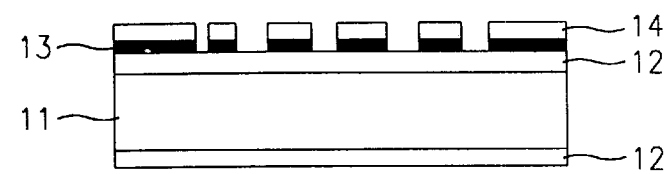
Figure 1D:
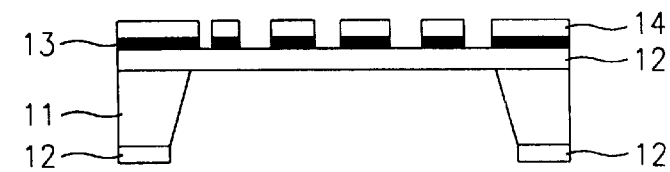
Figure 1E:
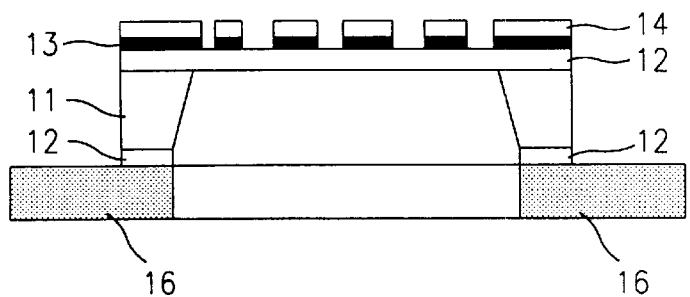
Figure 2:
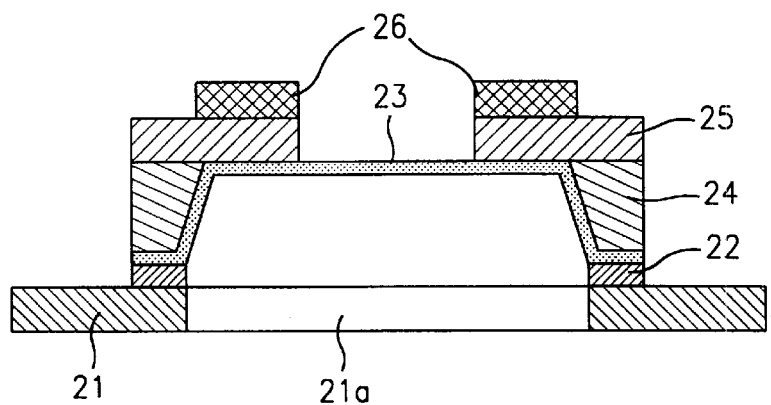
FIG. 2 is a cross-sectional view showing a mask for an X-ray lithography in accordance with the present invention.

As shown in FIG. 2, the mask for making a semiconductor device according to the present invention includes a glass frame 21 having an opening 21a in the center thereof. On an upper surface of the glass frame 21, a membrane film 23 formed of $SiN_x$ or SiC is attached using an adhesive 22. The membrane film 23 is upwardly offset extending from each end portion thereof, so that an upper portion of the membrane film 23 can be formed in parallel with the glass frame 21. A silicon support 24 is formed outwardly from each slanted portion of the membrane film 23.

On respective upper surfaces of the support 24 and the membrane film 23, an interlayer 25 of an oxide is formed and patterned to expose a predetermined portion of the interlayer 25. On the upper surface of the interlayer 25, a patterned light shield 26 formed of a material selected from Au, W and Ta is formed. The patterned light shield 26 and the patterned interlayer 25 are provided to expose at least a portion of the upper surface of the membrane film 23.

Figure 3A:
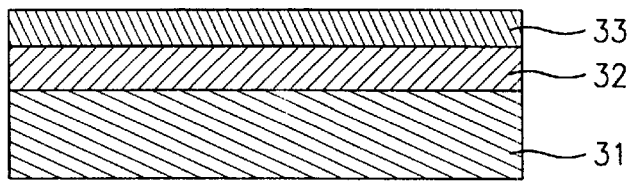
FIGS. 3A through 3I are cross-sectional views sequentially illustrating a mask fabrication method for a semiconductor device according to the present invention.

FIGS. 3A through 3I illustrate the mask fabrication method according to the present invention. As shown in FIG. 3A, an interlayer 32 formed preferably of an oxide is grown on a first silicon film 31. A second silicon film 33 is formed on the interlayer 32. Since the structure introduced in FIG. 3A is identical to that of a silicon on insulator (SOI) wafer, a ready-made SOI wafer can be employed.

Figure 3B:
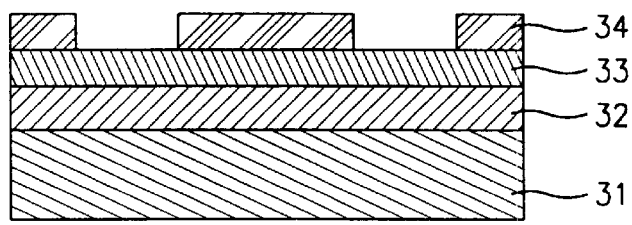

With reference to FIG. 3B, a photoresist film 34 is formed on the second silicon layer 33 and patterned so as to form in a following step a light shield 35 in the patterned portion thereof.

Figure 3C:
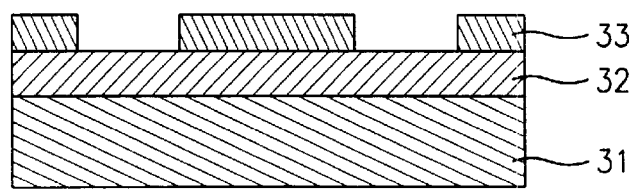

As shown in FIG. 3C, using the patterned photoresist film 34 as a mask, the second silicon layer 33 is etched to expose a portion of the interlayer 32 therethrough, and then the patterned photoresist film 34 is removed.

Figure 3D:
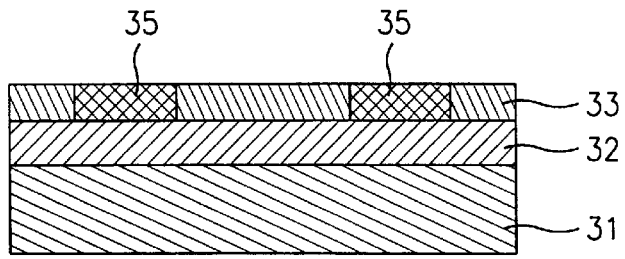

As further shown in FIG. 3D, on the second silicon layer 33 and the interlayer 32 externally exposed by etching the second silicon layer 33, a light shield 35 (that is, an absorber layer) formed of one selected from Au, W and Ta is deposited. Then, an etchback process is carried out so that the light shield 35 can remain preferably only on the exposed interlayer 32.

Figure 3E:
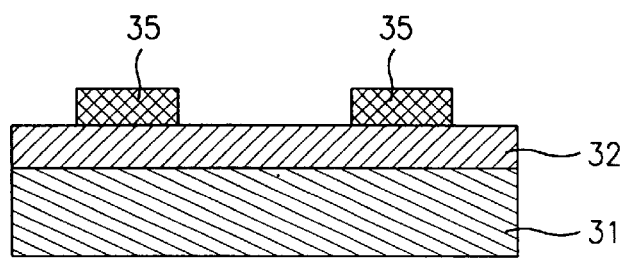

Referring to FIG. 3E, the remaining second silicon layer 33 is completely removed using a dry etching method such that the patterned light shield 35 remain preferably only on the interlayer 32. At this time, in order to remove the second silicon layer 33 without damaging the light shield 35, it is important to set a gas chemistry operation in consideration of an etch selection rate of the second silicon layer 33 and the light shield 35. The forming method of the light shield 35 set forth with reference to FIGS. 3B through 3E is realized using a lift-off method.

Figure 3F:
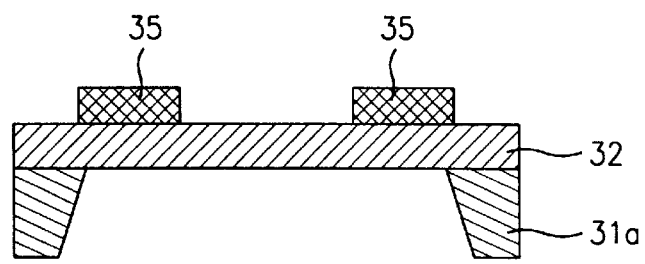
Figure 3G:
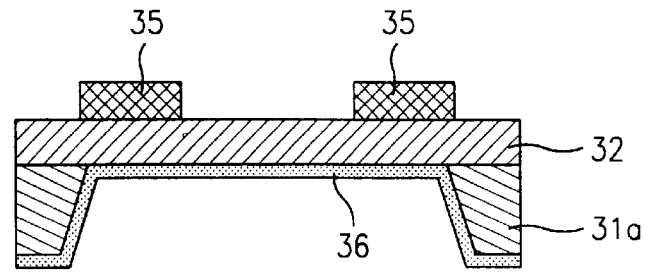

As shown in FIG. 3F, a central lower portion of the first silicon layer 31 is etched until the lower surface of the interlayer 32 is exposed to thereby form a silicon column 31a. As further shown in FIG. 3G, on the entire lower surface of the resultant structure, a membrane film 36 formed of material selected from $SiN_x$ and SiC is formed by using a low pressure chemical vapor deposition (LPCVD) process.

Figure 3H:
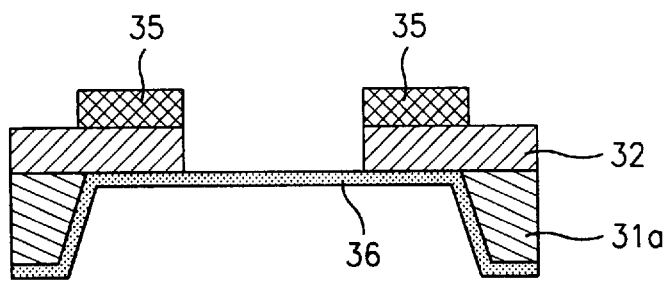

Next, as shown in FIG. 3H, the interlayer 32 portion, which does not have the patterned absorber layer 35 thereon, is removed to expose a central upper surface of the membrane film 36 therethrough. The partial removal of the interlayer 32, is carried out to improve an optical transmission and precisely aligning the mask with a lithographic object (for example, a wafer).

Figure 3I:
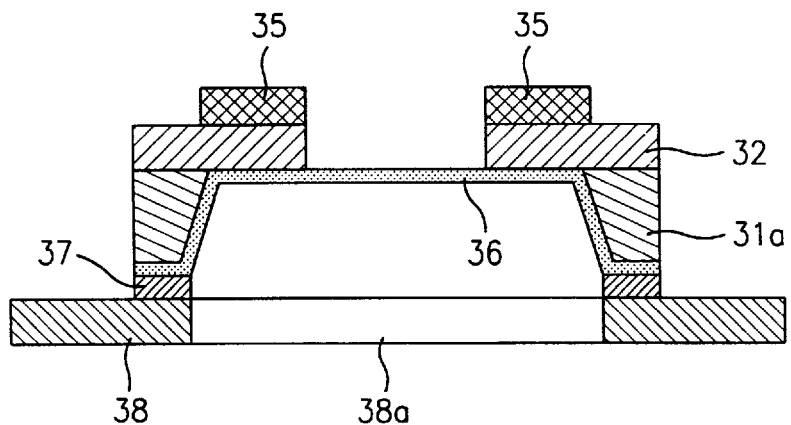

With reference to FIG. 3I, a glass frame 38 is attached by an adhesive 37 onto a lower edge portion of the membrane film 36 to complete the mask fabrication according to the present invention. The glass frame 38 has an opening 38a in a central portion thereof.

As described above, in the mask and the fabrication method thereof according to the present invention, the membrane film is formed in the last step after forming the light shield and such last step prevents the membrane film from being damaged and minimizes the distortion and stress thereof. Further, instead of a conventional dry etching method using plasma when forming the patterned light shield, a lift-off method is applied in the present invention for thereby preventing a mask stress in accordance with the plasma, and thereby minimizing an image displacement error which may occur on a wafer.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A mask for making a semiconductor device, comprising:
   a frame having an opening therein;
   a membrane film formed over the frame;
   a patterned interlayer formed on said membrane film;
   a patterned light shield formed on said interlayer such that said interlayer is formed between said light shield and said membrane film; and
   a support column formed on a lower surface of said interlayer and an upper surface of said membrane film.

2. The mask of claim 1, wherein the membrane film is formed of one of a material selected from SiN and SiC.

3. The mask of claim 1, wherein the light shield is formed of one of a material selected from Au, W and Ta.

4. The mask of claim 1, wherein the interlayer is formed of oxide.

5. The mask of claim 1, wherein the patterned interlayer and the patterned light shield have openings to expose a portion of an upper surface of the membrane film.

6. The mask of claim 1, wherein the membrane film is upwardly and angularly offset, so that an upper portion thereof is formed to be in parallel with the frame.

7. The mask of claim 1, wherein the frame is formed of glass.

8. The mask of claim 1, wherein the membrane film is attached by an adhesive to a peripheral edge of the opening.

9. The mask of claim 1, further comprising a support formed on a peripheral edge of the opening and on said membrane film.

10. The mask of claim 9, wherein the support is made of silicon.

11. The mask of claim 9, wherein said membrane film is formed on walls of said support.

12. The mask of claim 11, wherein said patterned interlayer is formed on an upper surface of said support.

13. The mask of claim 1, wherein said membrane film comprises a single layer.

14. The mask of claim 1, wherein said interlayer extends into the opening of the frame to form another opening.

15. A method of making a mask used for making a semiconductor device, comprising the steps of:
   forming an interlayer on a silicon layer;
   forming a light shield on the interlayer;
   etching a region of the silicon layer to expose a lower surface of the interlayer therethrough;
   forming a membrane film on a lower surface of the silicon layer and on the lower surface of the interlayer; and
   etching a region of the interlayer to thereby expose an upper surface of the membrane film such that the interlayer is formed between the membrane film and the light shield.

16. The method of claim 15, wherein for forming the light shield, a second silicon layer is formed on the interlayer and selectively etched to form a plurality of openings therethrough and a light shielding material is deposited in the plurality of openings the remaining second silicon layer is etched back.

17. The method of claim 15, wherein the membrane film is formed using a low pressure chemical vapor deposition (LPCVD) process.

18. The method of claim 15, wherein the membrane film is formed of one of a material selected from SiN and SiC.

19. The method of claim 15, wherein the light shield is formed of one of a material selected from Au, W and Ta.

20. The method of claim 15, wherein the light shield is patterned using a lift-off method.

21. The method of claim 15, wherein a frame having an opening therethrough is attached by an adhesive onto edge portions of the membrane film.

22. The method of claim 21, wherein the frame is formed of glass.

23. The method of claim 15, wherein for etching the silicon layer, an unetched portion of the silicon layer serves to support the membrane.

24. The method of claim 15, wherein said membrane film comprises a single layer.

25. A method for making a mask used for making a semiconductor device, comprising the steps of:

forming an interlayer on a first silicon layer;

forming a second silicon layer on the interlayer and selectively etching the second silicon layer to thereby form a plurality of openings therethrough;

forming a light shield in corresponding ones of the openings and on the second silicon layer;

etching the light shield formed on the second silicon layer to thereby expose the interlayer;

removing the remaining second silicon layer;

etching a region of the first silicon layer to expose a lower surface of the interlayer therethrough;

forming a membrane film on a lower surface of the silicon layer and on the lower surface of the interlayer; and etching a region of the interlayer to thereby expose an upper surface of the membrane film.

26. The method of claim 25, wherein said membrane film comprises a single layer.

27. A mask for making a semiconductor device, comprising:

a silicon support having an opening;

an interlayer formed on a first surface of the silicon support, wherein a portion of the interlayer extends at least to the opening of the silicon support;

a light shield formed on the interlayer; and a membrane film formed on a second surface of the silicon support and formed on the portion of the interlayer.

28. The mask of claim 27, wherein said membrane film is formed of one of a material selected from SiN and SiC.

29. The mask of claim 27, wherein said light shield is formed of one of a material selected from Au, W and Ta.

30. The mask of claim 27, wherein said interlayer is formed of oxide.

31. The mask of claim 27, wherein said interlayer and said light shield have patterned openings to expose a portion of an upper surface of the membrane film.

32. The mask of claim 27, wherein said membrane film is upwardly and angularly offset.

33. The mask of claim 27, further comprising a frame having an opening therein, wherein said membrane film is formed over said frame and attached to said frame by an adhesive to a peripheral edge of the opening.

34. The mask of claim 27, wherein said membrane film comprises a single layer.

35. The mask of claim 27, wherein said interlayer extends into the opening of the silicon support to form another opening.

* * * * *